United States Patent
Tanaka

[11] Patent Number: 5,953,611
[45] Date of Patent: Sep. 14, 1999

[54] METHOD OF FABRICATING NONVOLATILE SEMICONDUCTOR MEMORY DEVICES WITH SELECT GATES

[75] Inventor: Makoto Tanaka, Kakogawa, Japan

[73] Assignee: Ricoh Company, Ltd, Tokyo, Japan

[21] Appl. No.: 08/866,688

[22] Filed: May 30, 1997

[30] Foreign Application Priority Data

May 31, 1996 [JP] Japan .................................. 8-137343

[51] Int. Cl.⁶ .............................................. H01L 21/8247
[52] U.S. Cl. ............................................ 438/267; 438/596
[58] Field of Search .................................... 438/258, 262, 438/263, 266, 267, 593, 594, 595, 596

[56] References Cited

U.S. PATENT DOCUMENTS

| | | | |
|---|---|---|---|
| 4,203,158 | 5/1980 | Frohman-Bentchkowsky et al. | 257/321 |
| 4,698,787 | 10/1987 | Mukherjee et al. | 257/316 |
| 4,852,062 | 7/1989 | Baker et al. | 438/257 |
| 4,868,619 | 9/1989 | Mukherjee et al. | 257/316 |
| 5,070,032 | 12/1991 | Yuan et al. | 438/267 |
| 5,198,380 | 3/1993 | Harari | 438/257 |
| 5,229,631 | 7/1993 | Woo | 257/315 |
| 5,268,585 | 12/1993 | Yamauchi | 438/267 |
| 5,280,446 | 1/1994 | Ma et al. | 257/316 |
| 5,429,969 | 7/1995 | Chang | 438/267 |

FOREIGN PATENT DOCUMENTS 852915  3/1989  Japan .

OTHER PUBLICATIONS

Listing of Silicon Storage Technology, Inc. Patents.
SST Technical Paper entitled "SuperFlash EEPROM Technology", Aug. 1994, pp. 10.1–10.7.
Abstract of U.S. Patent No. 5229631 and attached Official Gazette Notice dated Jul. 20, 1993.

Primary Examiner—Chandra Chaudhari
Attorney, Agent, or Firm—Cooper & Dunham LLP

[57] ABSTRACT

A method of producing a nonvolatile semiconductor memory devices in which a source line is formed in a self-alignment fashion, wherein the nonvolatile semiconductor tunnel oxide film, a control gate electrode formed on the floating gate electrode, and a select gate electrode formed on the control gate electrode, and a part of the select gate electrode is disposed on the channel via a gate dielectric layer. The method includes the steps of: forming a side wall film, which will be used in self-alignment processing, on a side of the multilayer structure consisting of the floating gate electrode and the control gate electrode; implanting impurity ions into a region intended to become a source line in a self-alignment fashion using the side wall film as a mask thereby forming the source line; and forming the select gate electrode while keeping at least the portion of the film in the space above the drain line remaining without being removed.

9 Claims, 13 Drawing Sheets

METHOD OF FABRICATING NONVOLATILE SEMICONDUCTOR MEMORY DEVICES WITH SELECT GATES

BACKGROUND

1. Field of the Invention

The present application relates to a method of fabricating nonvolatile, electrically writable and erasable semiconductor memory devices having a floating gate electrode.

2. Description of the Related Art

Among nonvolatile semiconductor memories that are electrically writable and erasable (EEPROMs), the popularity of flash EEPROMs, also known as flash memories, has increased in recent years. In conventional EEPROMs, erasing is generally performed bit by bit, while in flash memories erasing is performed block by block. Although block-by-block erasing makes flash memory devices more difficult to use as compared to conventional EEPROMs, the simple structure of flash memory devices in which one bit of data is stored in a single cell and data is erased in blocks allows flash memory devices to be highly integrated. As a result, the density of flash memory devices is similar to or greater than the that of dynamic random access memory devices (DRAMs). This high integration density makes flash memory devices desirable for use as next generation read only memory devices.

With the increased interest in flash memory devices, various structures of flash memories have been proposed. One such flash memory device is disclosed in U.S. Pat. No. 5,280,446. FIGS. 21 to 23 illustrate such a flash memory device. FIG. 21 is a plan view of this flash memory device, FIG. 22 is a cross-sectional view of the device of FIG. 21 taken along line S–S', and FIG. 23 is a cross-sectional view of FIG. 21 taken along line C–C'. In this flash memory device, each memory cell has a channel region L, including two subchannel regions L1 and L2, that is formed on a substrate 100 or in a well between a source line 8 and a drain line 7. On the subchannel region L2 located adjacent the source line, a select gate electrode 9a is formed on a gate dielectric layer 10. On the subchannel region L1 located adjacent the drain line, a floating gate electrode 4 is formed on a tunnel oxide film 3.

Each memory cell is isolated by a device isolation field oxide layer (LOCOS) 2 formed on the substrate 100. A control gate is formed on the floating gate 4. The control gate 6 includes a control gate electrode 6a and an insulating layer 6b formed on the control gate electrode. The control gate 6 is made up of a line-shaped polysilicon layer disposed on the floating gate 4 via an inter-poly dielectric layer 5. The control gate 6 extends along the channel width (W). The floating gate 4 and the control gate 6 form a first multilayer region (hereinafter referred to as a stacked gate structure). A select gate 9 is formed on the stacked gate structure and also on a second region on the substrate adjacent the stacked gate. This second region is also referred to as a split gate region. The select gate is formed on the stacked gate structure and the split gate region via insulating films 6b and 10, respectively. The select gate line 9 includes a select gate electrode 9a and an insulating layer 9b formed thereon.

The source line 8 and the drain line 7 are each formed of a substrate diffusion region extending parallel to the control gate 6. The source line 8 is in an offset position relative to the control gate 6. As indicated above, the channel region L between the source line 8 and the drain line 7 consists of two subregions L1 and L2 corresponding to the stacked gate region and the split gate region, respectively. The subregion L1 is also referred to as a drain side channel region and the subregion L2 is also referred to as a source side channel region.

In FIGS. 21–23, reference numeral 1 denotes an active substrate region, and reference numeral 50 denotes a contact hole. With the above structure, channel hot electrons are injected into the floating gate 4 from the region between the stacked gate structure (the region where the floating gate exists) and the split gate region. The above injection technique is known as source side injection (SSI) and allows a high electron injection efficiency.

With the memory elements (or cells) arranged in an array or matrix, any one memory element can be selected by designating a control gate 6 and a select gate 9 thereby designating an intersection. Further, two neighboring memory elements in the array which are directly adjacent to each other via a diffusion region (source or drain) may share the same source or drain. This allows a reduction in the cell area and thus an increase in the integration density.

For the device shown in FIGS. 21–24, the substrate diffusion layers are formed as follows. A resist pattern 30 is formed over, for example, a portion of the stacked gate structures and subregions (e.g., subregion L2) of the channel region L by means of photolithography processing. Then impurity ions (such as arsenic ions or phosphorus ions) are implanted into the substrate using the resist pattern 30 as a mask. In the above process of forming the diffusion layer, the implantation for the drain line 7 is preformed in a self-alignment fashion, while the position of the source line is defined by the resist mask 30.

In the above technique, since formation of the source line 8 involves using the resist film 30 as a mask and patterning by means of the photolithography technology, the uniformity of the channel length of the select gate 9 of the flash memory device is limited by the alignment accuracy of the photolithography process. Variations in the channel length can cause an increase in leakage current over the entire memory array. Channel length variations can also cause variations in the threshold voltage and the "on" voltage of a select transistor and the "on" current of memory cell. These variations in the memory characteristics can lead to memory cell failure, and limit the minimum size of conventional flash memory devices.

One attempt to overcome this drawback and achieve further reductions in the memory cell size, was to use a self-alignment technique in terms of the split gate length. Japanese Patent Application No. 8-52915 discusses such a split gate length self-alignment technique. This technique is characterized in that a first side film is formed on the side of the multilayer structure consisting of the floating gate electrode and the control gate electrode, then impurity ions are implanted into a region intended to become a source line in a self-alignment fashion using the first side wall film as a mask to form the source line. A second side wall film having a thickness (measured in a lateral direction in the structure) that is smaller than the thickness of the first side wall film is then formed. The second side wall is used as an insulating layer between the stacked gate and the select gate.

However, in the technique discussed in the Japanese application, a large number of steps are required to fabricate such a memory device. Further, the techniques used to fabricate such memory devices are complex. As a result, the fabrication processes for making these memories is time consuming and costly.

SUMMARY

The present application provides methods of fabricating flash memory devices that reduces the manufacture time and the cost associated with fabricating such devices. One method contemplated by the present application includes defining a split gate length in a self-alignment manner in a memory cell having a channel region L between source and drain lines. The channel region L includes two subregions L1 and L2 which allow a reduction in the slope (steepness) and/or height of geographical steps and provides an improvement in the resolution in the photolithography processing. Further, reducing the height of geographical steps makes the etching process easier and reduces the number of processing steps. As a result, the time and costs for fabricating such memory devices are reduced.

BRIEF DESCRIPTION OF THE DRAWINGS

Preferred embodiments of the invention are described hereinbelow with reference to the drawings wherein:

FIGS. 12a and 12b illustrate a method of fabricating the memory device according to a second embodiment of the invention, wherein FIG. 12a is a plan view and FIG. 12b is a cross-sectional view;

FIGS. 13a and 13b illustrate the method of fabricating the memory device according to the second embodiment of the invention, wherein FIG. 13a is a plan view and FIG. 13b is a cross-sectional view;

FIGS. 14a and 14b illustrate a conventional memory device structure in which a polysilicon layer used as a side wall is not used to form a first layer film of a gate electrode of a peripheral circuit, wherein FIG. 14a is a cross-sectional view of a memory cell and FIG. 14b is a cross-sectional view of the peripheral circuit;

FIGS. 15a and 15b illustrate a conventional memory device structure in which the polysilicon layer used as a side wall is not used to form the first layer film of the gate electrode of the peripheral circuit, wherein FIG. 15a is a cross-sectional view of a memory cell and FIG. 15b is a cross-sectional view of the peripheral circuit;

FIGS. 16a and 16b illustrate a memory device structure in which a polysilicon layer used as a side wall is also used to form a first layer film of a gate electrode of a peripheral circuit, wherein FIG. 16a is a cross-sectional view of the memory cell and FIG. 16b is a cross-sectional view of the peripheral circuit;

FIGS. 17a and 17b illustrate a device structure in which the polysilicon layer used as the side wall is also used to form the first layer film of the gate electrode of the peripheral circuit, wherein FIG. 17a is a cross-sectional view of the memory cell and FIG. 17b is a cross-sectional view of the peripheral circuit;

FIGS. 18a and 18b illustrate a device structure in which the polysilicon layer used as the side wall is also used to form the first layer film of the gate electrode of the peripheral circuit, wherein FIG. 18a is a cross-sectional view of the memory cell and FIG. 18b is a cross-sectional view of the peripheral circuit;

DETAILED DESCRIPTION

Figure 1:
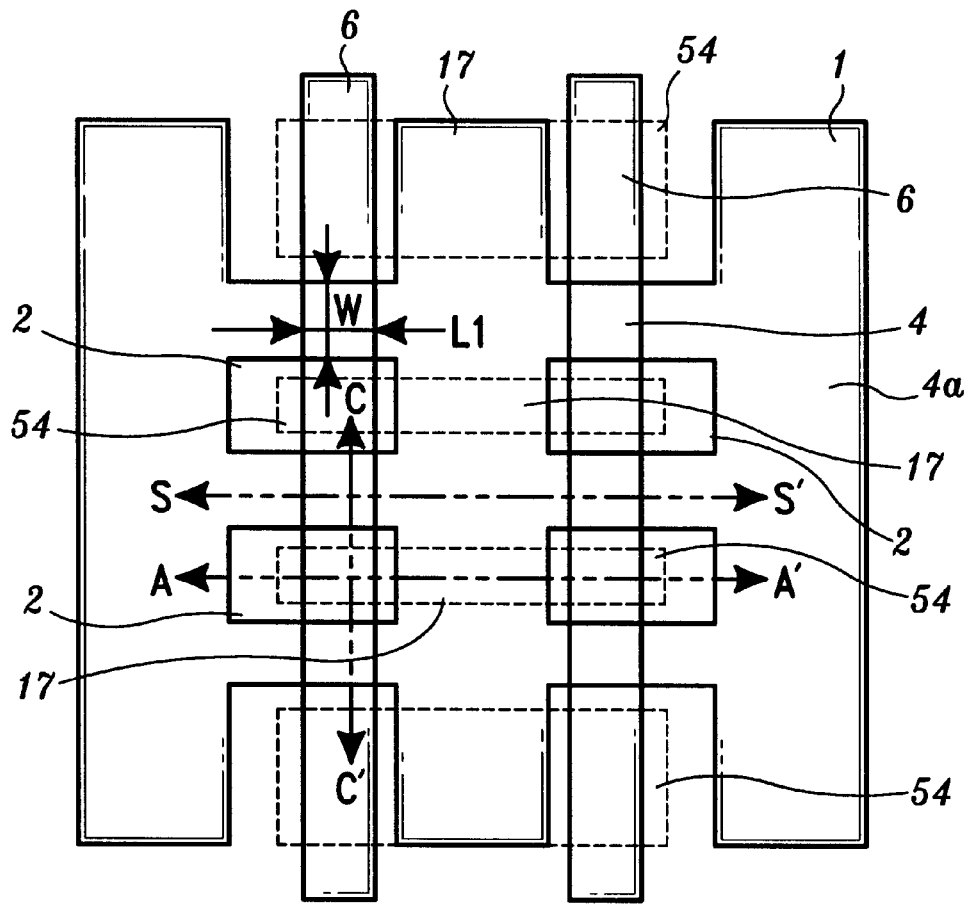
FIG. 1 is a plan view of a memory device of a first embodiment at a stage of manufacture where a control gate has been formed.

The present application relates to a method of producing flash memory arrays in which each channel region L disposed between a source line 8 and a drain line 7 consists of two subregions. The first subregion L1 is also identified as a drain side channel region, and the second subregion L2 is identified as a source side channel region. A split gate length is formed in a self-alignment fashion using a first side wall formed on a side of a stacked gate having a multilayer structure that includes a floating gate electrode and a control gate electrode. A portion of the first side wall is formed on the side of the stacked gate and is used in the self-alignment processing and may remain without being removed. Alternatively, a portion of the first side wall may be used as a part of a select gate so as to reduce the slope of the side wall. This provides an improvement in the resolution of the photolithography process. Furthermore, the etching process becomes easier and the number of processing steps are reduced. The invention will be described in further detail below with reference to preferred embodiments in conjunction with the accompanying drawings. In the figures, similar parts or elements are denoted by similar reference numerals.

Referring to FIGS. 1–4, a field oxide film 2 serving to separate wells and device elements from each other is formed on a p-type silicon semiconductor substrate 100. A tunnel oxide film 3 and a polysilicon layer 4a serving as a floating gate electrode 4 are then formed on the substrate 100. The polysilicon layer 4a is etched using a known photolithography techniques including resist coating and development processing and also dry etching techniques so as to form an opening in each region 54 (surrounded by the broken lines shown in FIG. 1) so that when a control gate line (stacked gate structure) is formed in a later processing step a floating gate electrode 4 in each region 54 will be separated automatically.

Figure 2:
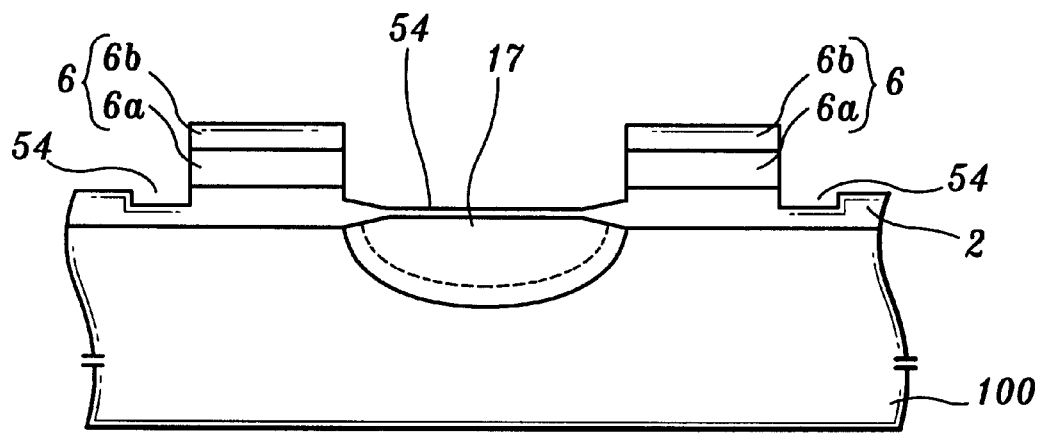
FIG. 2 is a cross-sectional view of the memory device of FIG. 1 taken along line A–A'.
Figure 3:
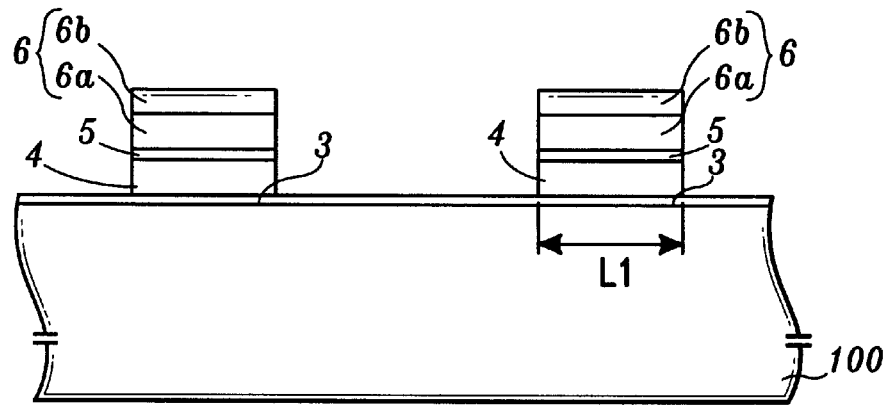
FIG. 3 is a cross-sectional view of the memory device of FIG. 1 taken along line S–S'.
Figure 4:
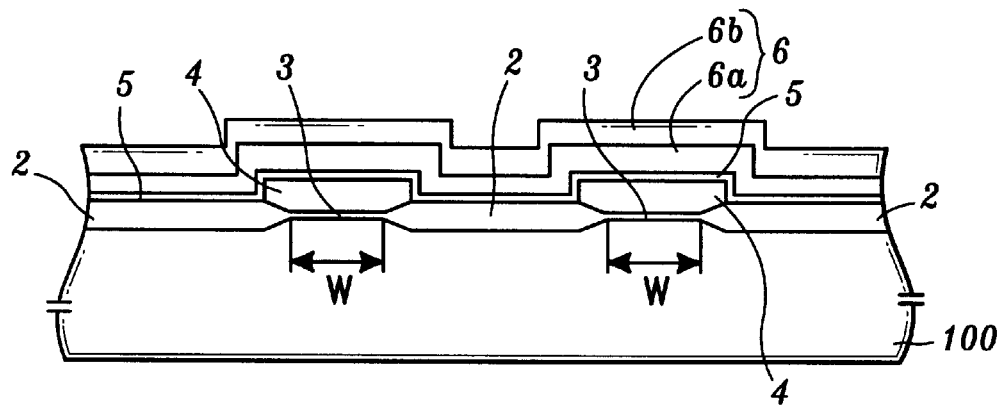
FIG. 4 is a cross-sectional view of the memory device of FIG. 1 taken along line C–C'.

When the control gate line 6 is formed, substrate areas 17 exposed via the openings of the polysilicon layer 4a can be undesirably etched. This often results in formation of an unwanted residual in the following step of forming the select gate electrode 9 The above residual of the polysilicon layer 9a can cause an electrically short path between select gate electrodes 9. To avoid the above noted problems associated with the unwanted substrate etching, the substrate areas 17 exposed via the openings of the polysilicon layer 4a are implanted with impurity ions of the same type as that of impurity ions for the diffusion region (e.g., As or P ions for n-type impurities) so that enhanced oxidation due to the doped impurities occurs on the surface of the exposed substrate areas 17. These areas are directly used as a part of the drain line (FIGS. 1 and 2).

An inter-poly dielectric layer 5 having an ONO (oxide/nitride/oxide) structure is then formed to provide insulation between the first polysilicon layer 4a serving as the floating gate electrode 4, and a control gate electrode 6a made up of a polysilicon layer serving as the control gate line 6 which will be described in greater detail later.

Various techniques may be employed to form the inter-poly dielectric layer 5 with the ONO structure. For example, the bottom and top oxidation films of the ONO structure may be formed by means of oxidation process and/or CVD process.

The timing of the formation of the inter-poly dielectric layer 5 is not limited to the time of ion implantation for enhanced oxidation. For example, the inter-poly dielectric layer may also be formed before the ion implantation for enhanced oxidation, or the bottom oxidation film and the interlayer nitride film may be formed before forming openings in the polysilicon layer 4a. The timing of forming the inter-poly dielectric layer 5 may vary depending on the specific process employed.

A polysilicon layer 6a serving as the control gate electrode is then formed. After that, an insulating film 6b is formed for providing insulation between the polysilicon layer 6a and a polysilicon layer 9a serving as the select gate electrode which will be described later.

The insulating layer 6b, the polysilicon layer 6a for the control gate electrode, the interpoly dielectric layer 5, and the polysilicon layer 4a for the floating gate electrode are then etched using known photolithography techniques and dry etching techniques so as to form a stacked gate (first multilayer region seen in FIGS. 1 to 4). In FIG. 1, reference numeral 1 denotes an active substrate region having no LOCOS film.

Figure 5:
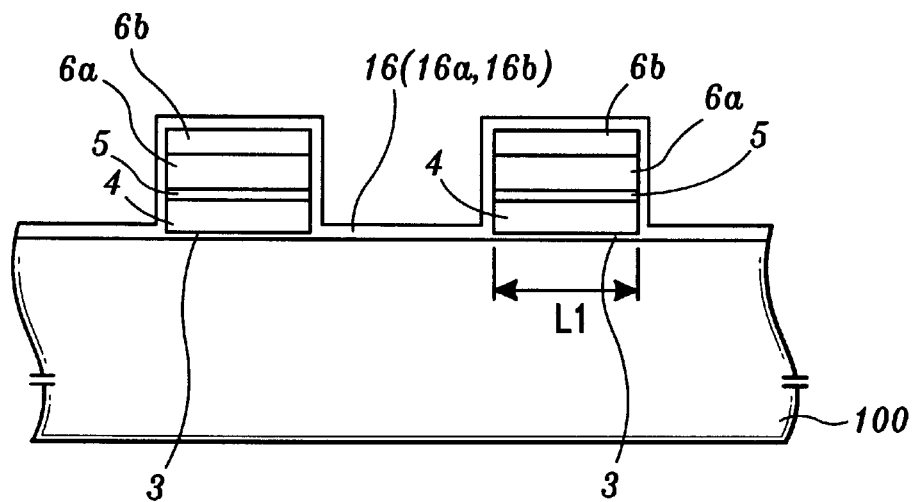
FIG. 5 is a cross-sectional view similar to FIG. 3, illustrating the memory device according to the first embodiment of the invention at a different stage of manufacture.
Figure 10:
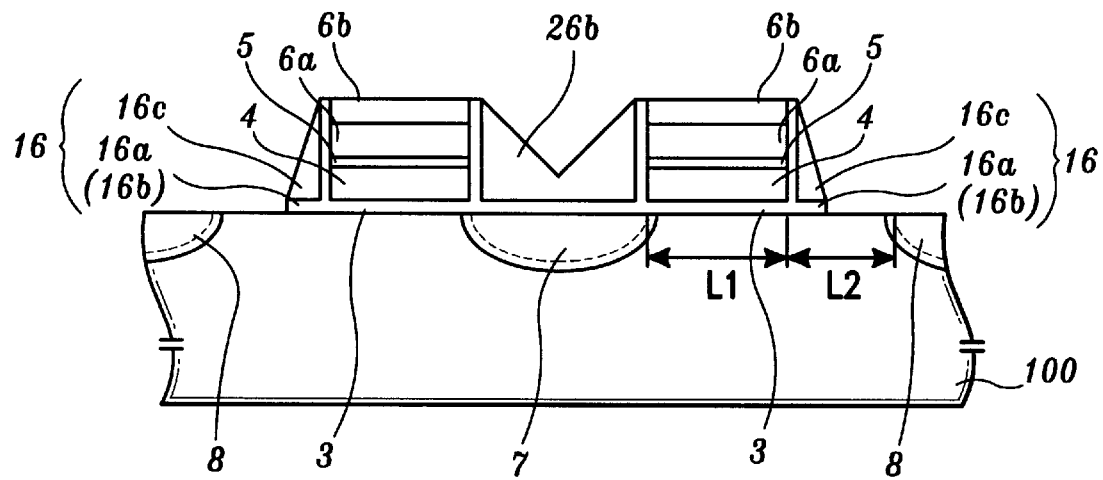
FIG. 10 is a cross-sectional view similar to FIG. 3, illustrating the memory device according to the first embodiment of the invention at another stage of manufacture.

Subsequently, an insulating layer 16 is formed over the stacked gate structure, as seen in FIG. 5. The insulating layer 16 may be a single layer or a multilayer film of oxide and/or nitride. The single layer or multilayer film of oxide or/and nitride is preferably formed by CVD. This single-layer or multilayer film is etched back in a later processing step so as to form an insulating side wall 16 on the sides of the stacked gate (FIG. 10). The side wall 16 provides better insulation between the control gate electrode 6a and the select gate electrode 9a. The side wall 16 also provides better controllability in terms of the gap (side wall thickness) between the split gate region and the floating gate electrode 4. The thickness of the side wall 16 is a factor determining the SSI efficiency. In the present embodiment, the insulating film 16 is a multilayer film that includes an oxide film 16a and a nitride 16b formed by CVD.

Figure 6:
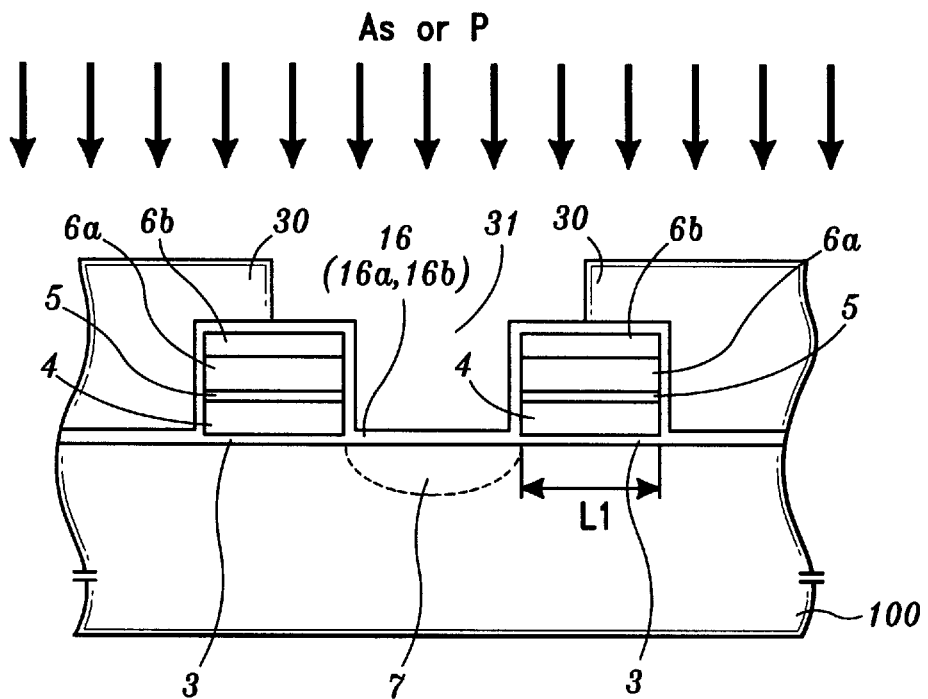
FIG. 6 is a cross-sectional view similar to FIG. 3, illustrating the memory device according to the first embodiment of the invention at a stage of manufacture where impurity ions are implanted into drain lines.
Figure 7:
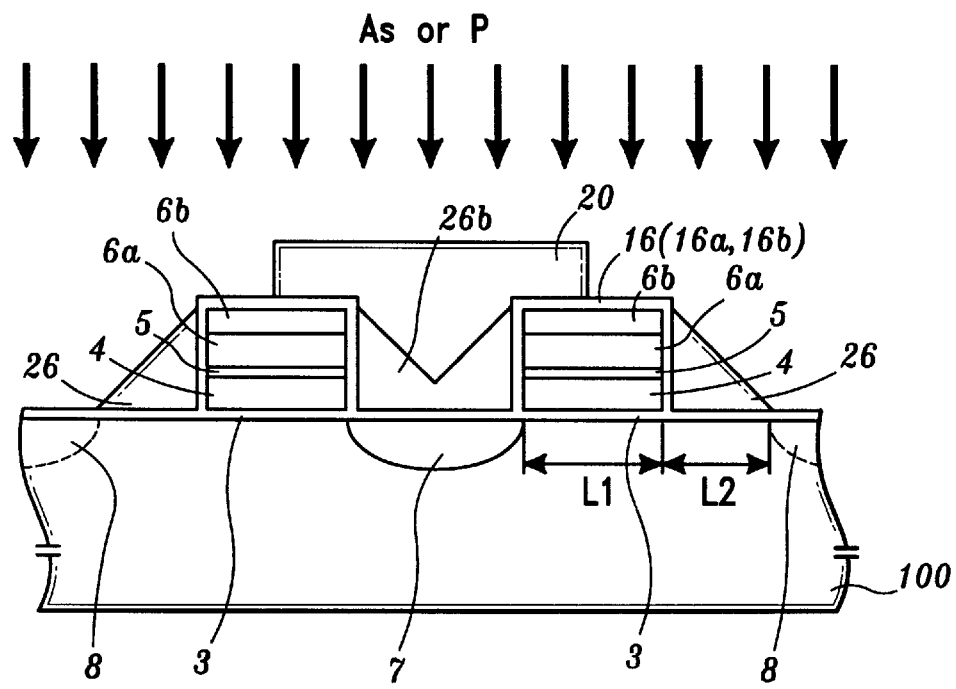
FIG. 7 is a cross-sectional view similar to FIG. 3, illustrating the memory device according to the first embodiment of the invention at a stage of manufacture where impurity ions are implanted into source lines.
Figure 8:
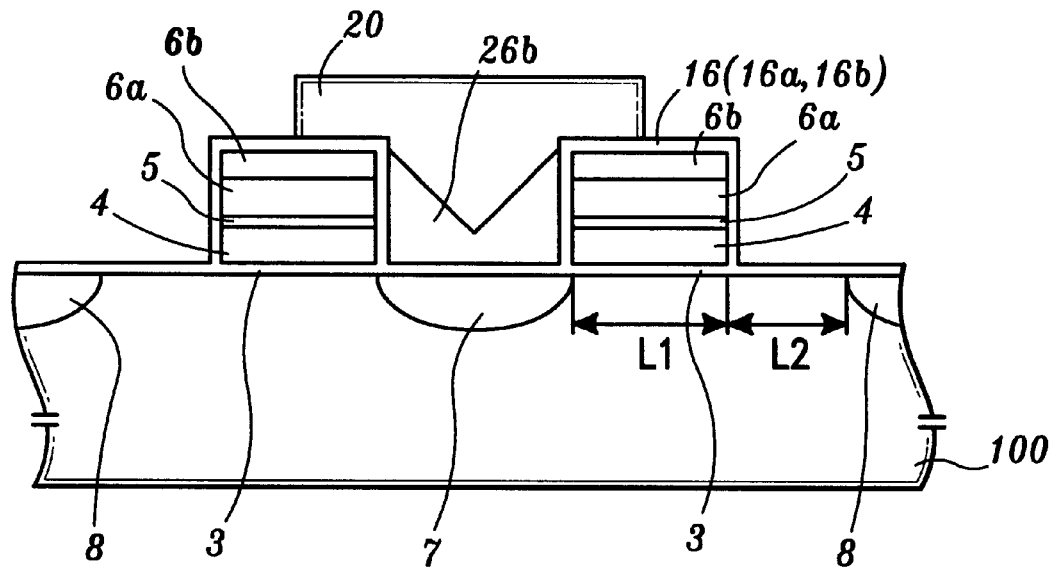
FIG. 8 is a cross-sectional view similar to FIG. 3, illustrating the memory device according to the first embodiment of the invention after removal of a part of the side walls of stacked gate structures.
Figure 24:
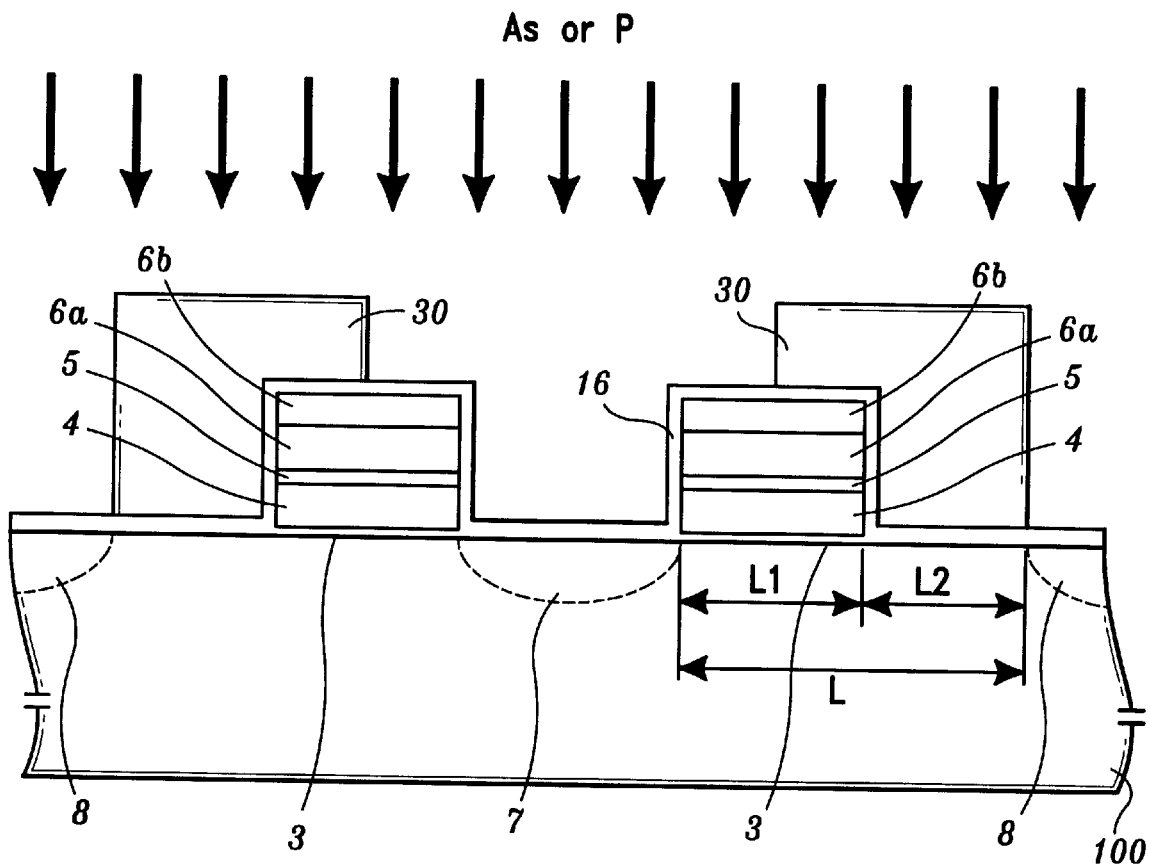
FIG. 24 is a cross-sectional view illustrating a conventional method for fabricating source and drain lines.

Referring now to FIGS. 6 and 7, after forming the multilayer films 16a and 16b, serving as the insulating side wall, a substrate diffusion region (source/drain) is formed. In the conventional technique, as shown in FIG. 24, the source line 8 and the drain line 7 are formed by implanting impurity ions (e.g., As or P ions) into the substrate using the resist pattern 30 as a mask. In the present application, in contrast, a first side wall 26 is formed on the multilayer insulating side wall films 16a and 16b formed on the sides of the stacked gate structure. The side wall 26 can be, for example, an oxide film or a polysilicon film.

Using this side wall 26 as a mask, a source line 8 is formed in a self-alignment fashion to define a split gate length L2. In the present embodiment, the drain line 7 and the source line 8 are formed separately. Formation of the drain line is shown in FIG. 6. To form the drain line a resist pattern 30 is formed by photolithography so that the region where the drain line 7 is to be formed is exposed through a window 31, and the region where the source line 8 is to be formed is masked by the resist pattern 30. Arsenic or phosphorus ions serving as an n-type impurity are then implanted in the region where the drain line 7 is to be formed thereby forming the drain line 7.

Subsequently, as shown in FIG. 7, a silicon oxide film is deposited by CVD and this silicon oxide film is etched back so as to form the thick side wall film (first side wall film) 26 serving as a self-alignment mask for ion implantation. As a result of the formation of the above side wall film, the region above the drain line 7 is filled with the side wall film 26b. The resist film 20 is then patterned such that the silicon oxide film 26 in the region where the common source line 8 is to be formed is exposed. The resist films 20 and 30 also serve as a mask for preventing the peripheral MOS regions from being implanted with the impurity ions during the following implantation process. Impurities, such as As or P ions, serving as n-type impurities are implanted in a self-alignment fashion using the side wall film 26 and the resist film 20 as masks to form the source line 8.

In this embodiment, a part of the silicon oxide side wall films 26 and 26b are not removed and are used in subsequent process steps or are used as a part of the final memory device. The presence of the side wall film allows subsequent process steps to be performed more easily as will be described below.

For half micron or subhalf-micron devices, where the drain lines are narrower in width and height, difficulties in achieving sufficient resolution in the photolithography process may arise. For example, the coverage (and/or thickness) of the polysilicon layer 9a and tungsten silicide layer 9b forming the select gate electrode near the edges of the stacked gate structure may not be sufficient relative to the thicknesses in other regions. In addition, a cross section of the select gate line has a reverse tapered shape (overhang) at its edges. As a result, underdevelopment occurs near the corners of grooves in the photolithography process. This may result in an undesirable residual of the resist, which may cause an electrical short circuit between the select gates 9.

In the present embodiment, to avoid electrical short circuits between select gates, the side wall 26 on the side of the source line 8 is removed by wet etching using the resist mask 30 formed in the previous processing step. Further, the side wall film 26b on the side of the drain line 7 is not removed, reduces the slope of the side wall and/or the height of geographical steps, and prevents the creation of the unwanted residual of resist.

In the above fabrication method, since the resist mask 20 used in the self-alignment ion implantation is also used in the following wet etching process, neither an additional mask nor an additional photolithography process is required. In the above ion implantation process, the resist mask 20 serves also to prevent peripheral MOS regions from being implanted with ions.

Figure 9:
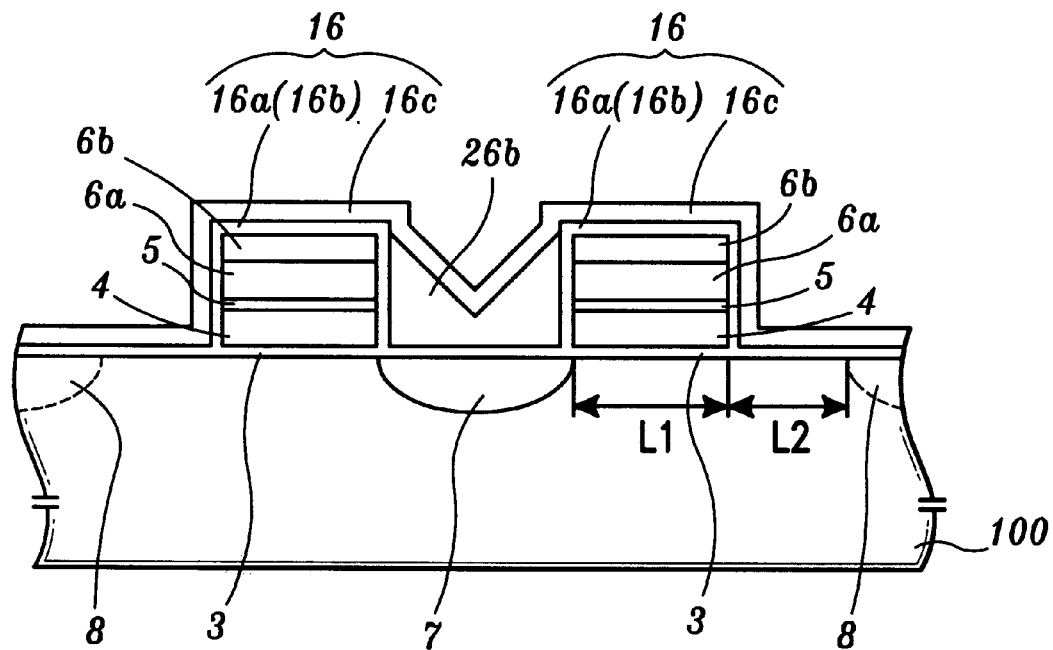
FIG. 9 is a cross-sectional view similar to FIG. 3, illustrating the memory device according to the first embodiment of the invention at another stage of manufacture where an insulating layer is formed over the stacked gate structures.

After removing the side wall 26 on the side of the source line 8 as described above, an oxide film 16c is formed as shown in FIG. 9. Then as seen in FIG. 10, the multilayer films 16b and 16c are dry-etched back, and the oxide film 16a and the tunnel oxide film 3 in the split gate region are removed by, for example, wet etching.

Figure 11:
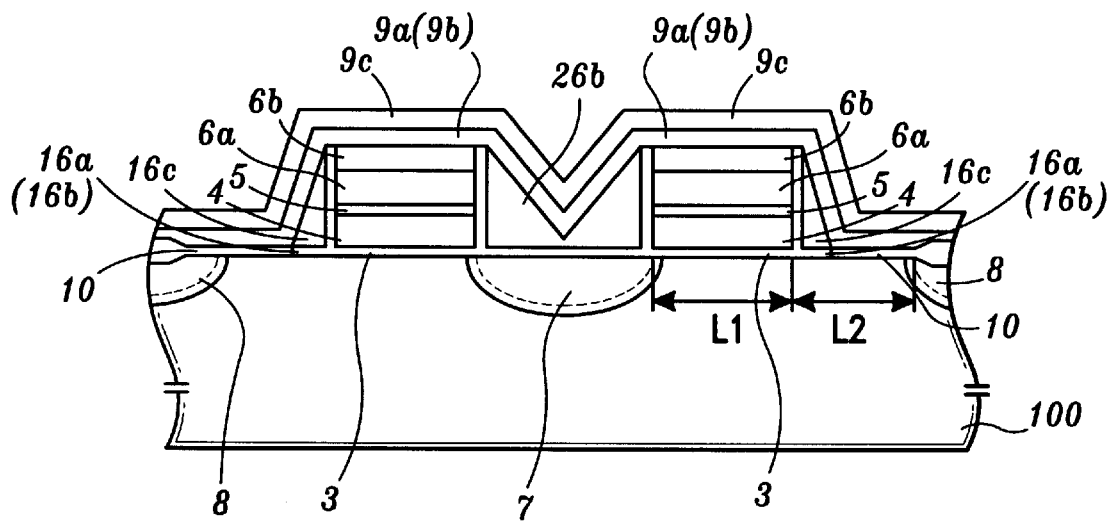
FIG. 11 is a cross-sectional view similar to FIG. 3, illustrating the memory device according to the first embodiment of the invention after a select gate is formed.

The select gate line 9 is then formed as shown in FIG. 11. That is, a gate oxide film 10 is formed first, and then a polysilicon film 9a and a tungsten silicide film 9b are formed. An insulating film 9c of silicon oxide is then formed on the polysilicon film 9a and the tungsten silicide film 9b. Then photolithography and dry etching are performed so as to form the select gate line 9 extending in a direction perpendicular to the control gate line 6. In FIG. 11, the select gate 9 is not limited to the single layer of, for example, polysilicon film but may also be a multilayer film that includes polysilicon film 9a and tungsten silicide film 9b. In the following processing steps, peripheral gate transistors and interconnections are formed using a conventional techniques.

Furthermore, the side wall film 26 used as the mask in the self-alignment processing is not limited to the silicon oxide film, and the above description illustrates only an example.

Figure 12A:
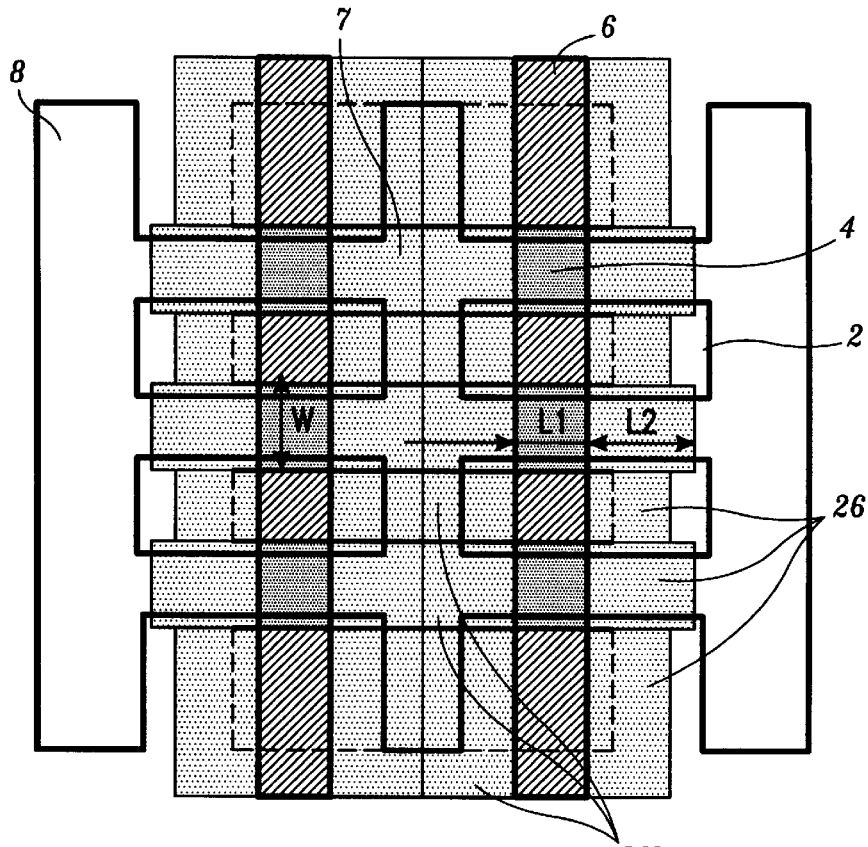
Figure 12B:
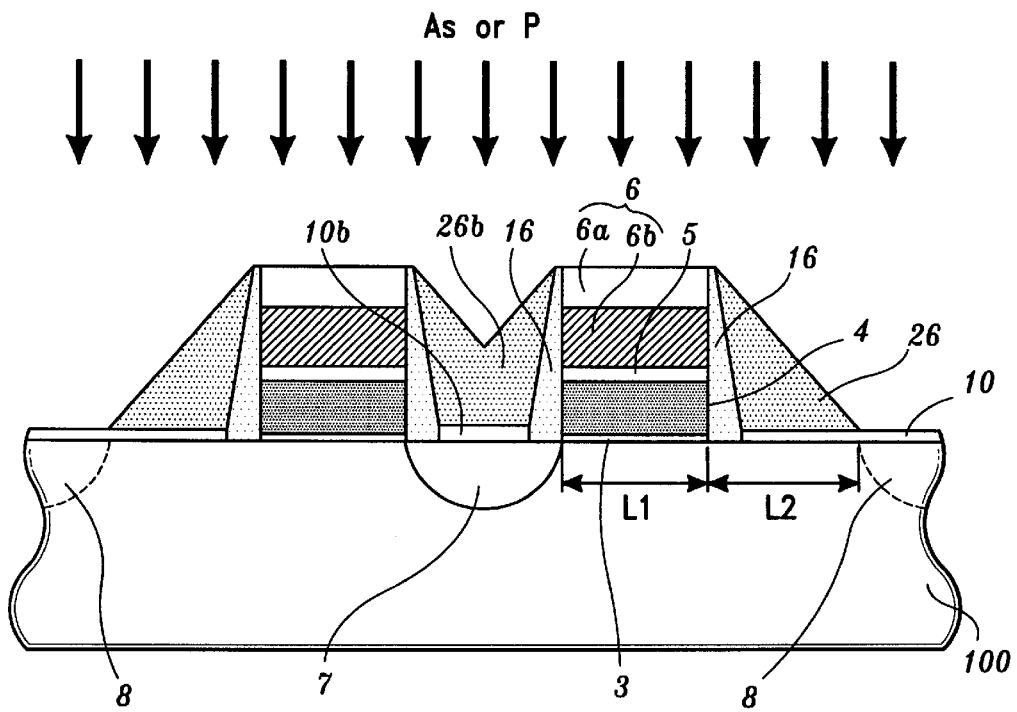
Figure 13A:
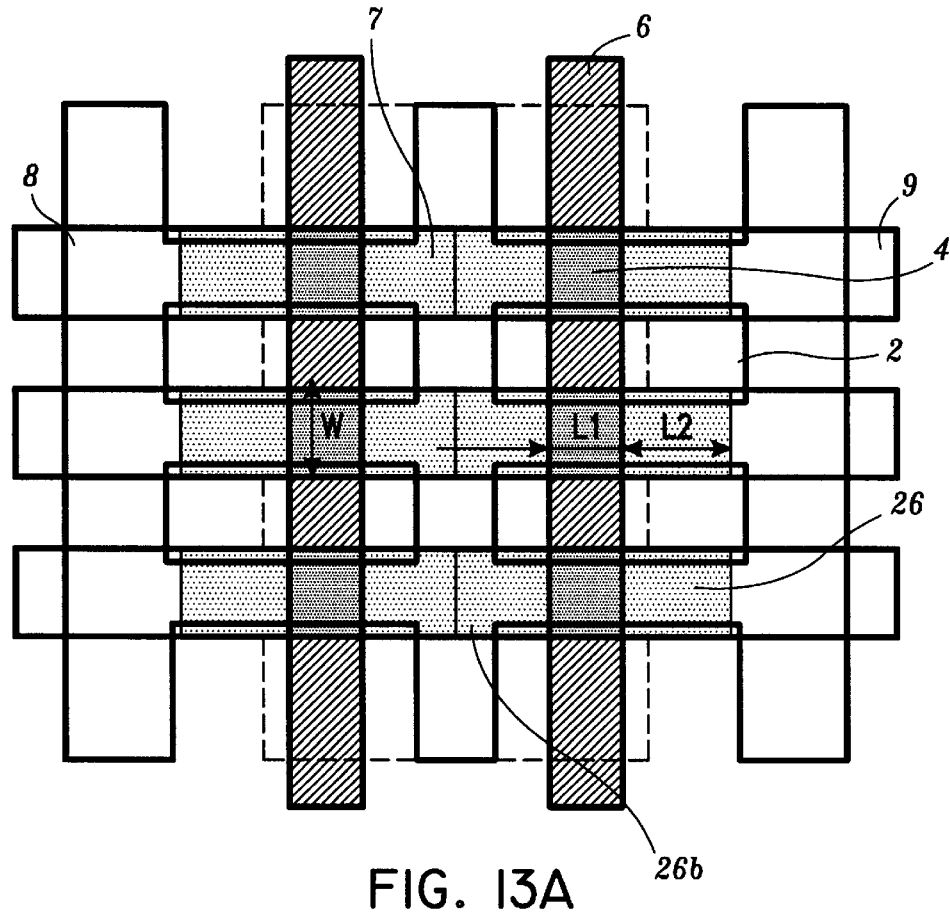
Figure 13B:
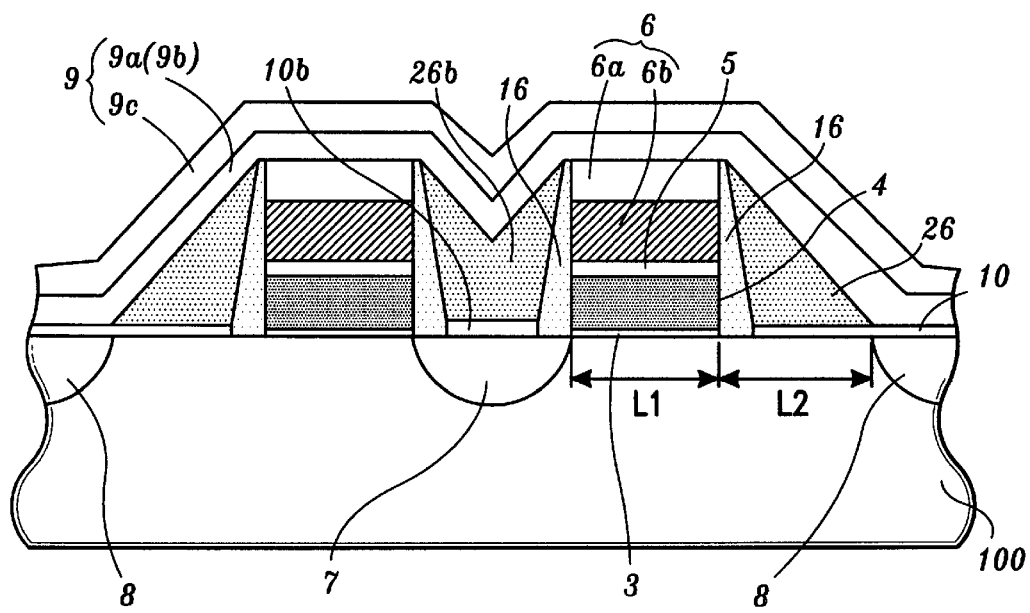

FIGS. 12 and 13 illustrate a second embodiment of the invention wherein FIG. 12(a) is a plan view, FIG. 12(b) is a cross-sectional view of FIG. 12(a), FIG. 13(a) is a plan view, and FIG. 13(b) is a cross-sectional view of FIG. 13(a). In this second embodiment, the side wall film 26 used as a mask in the self-alignment processing is also used as a part of the select gate.

As shown in FIGS. 1 to 4, after forming a stack gate with the multilayer structure consisting of a floating gate 4 and a control gate 6, an insulating side wall 16 is formed on the sides of the stack gate associated with the drain line. Then, as in the previous embodiment described above with reference to FIG. 7, a drain line 7 is formed by implanting As or P ions using a resist film 30 as a mask. Subsequently, a gate oxide film 10 is formed on the substrate 100 in the split gate region.

A thick polysilicon side wall film 26 used in the self-alignment ion implantation processing is then formed. In this process, the space above the drain line 7 is filled with the polysilicon side wall film 26b. Then, as shown in FIGS. 12a and 12b, As or P ions serving as an n-type impurity are implanted using the side wall films 26 and 26b as a mask thereby forming the source line 8.

To form a select gate 9, a multilayer film is formed on the polysilicon side wall films 26a and 26b. The multilayer film may include, for example, a polysilicon film 9a, a high melting point silicide film 9b and a protective insulating film 9c that protects the high melting point silicide layer. Then, as seen in FIG. 13b, the multilayer film 9a, 9b, 9c and the polysilicon side wall 26 are patterned so as to form the select gate line 9 extending in a direction perpendicular to the control gate line 6. In the above processing, if desired, the formation of the protective insulating film 9c may be omitted.

The technique described above provides, for example, a reduction in the number of processing steps compared to the technique in which the polysilicon side wall film 26 is not removed. Furthermore, no abrupt steps are formed on either the side of the drain line 7 or the source line 8. As a result, the photolithography and etching processes for forming the select gate line 9 are more efficiently performed.

If the multilayer films 9a and 9b for the select gate are formed on the polysilicon side wall 26, and if the polysilicon layer is directly formed on the side wall 26, a thin native oxide may be present on the surface of the polysilicon side wall 26 which can cause poor electrical contact. If the high melting point silicide layer is directly formed on the side wall 26 poor adhesion between the silicide layer and the insulating film 6b may occur. In the present embodiment, to avoid the above problems, a thin polysilicon layer having a thickness of about 10 to 30 mm is formed first and then a high melting point metal layer is formed on the polysilicon layer. As a result, good contact adhesion and good electrical contact is made. These results are achieved because the upper layer of high melting point silicide can be alloyed with the polysilicon and thin oxide films.

The entire multilayer film or a portion thereof and the polysilicon side wall 26 disposed thereon may be used to form gate electrodes of peripheral MOS device elements. This allows a reduction in the number of processing steps.

Figure 14A:
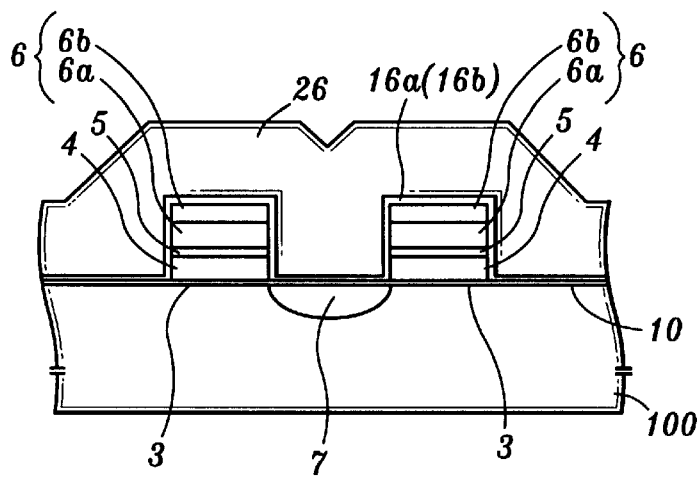
Figure 14B:
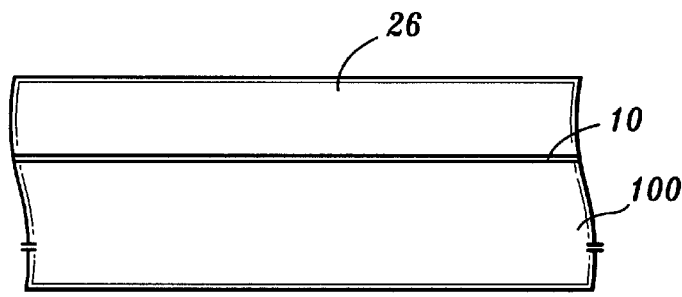
Figure 15A:
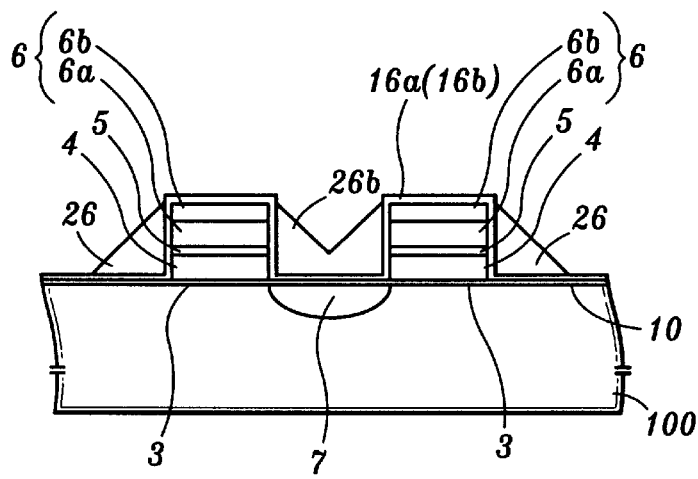
Figure 15B:
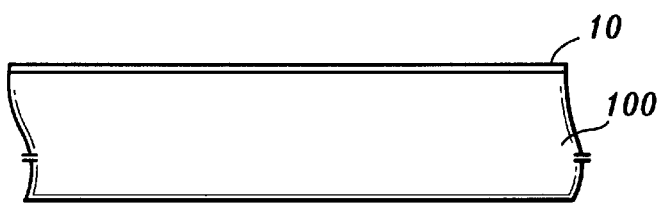

FIGS. 14 and 15 are cross-sectional views illustrating a conventional structure in which the polysilicon side wall 26 is not used as a first layer for forming the gate electrode of the peripheral circuit. Whereas, FIGS. 16–18 are cross-sectional views illustrating a structure in which the polysilicon side wall 26 is used as the first layer for forming the gate electrode of the peripheral circuit.

When the polysilicon film 26 is not used in the peripheral circuit, the polysilicon side wall 26 is formed first as shown in FIG. 14, and then the polysilicon side wall 26 is etched back. In the etching-back process for this conventional structure, the gate oxide film 10 in the peripheral circuit is exposed as shown in FIG. 15. Therefore, in conventional structures it is required to perform gate oxidation again. As a result, with conventional structures formation a polysilicon layer and/or a high melting point metal layer or a metal silicide is difficult.

Figure 16A:
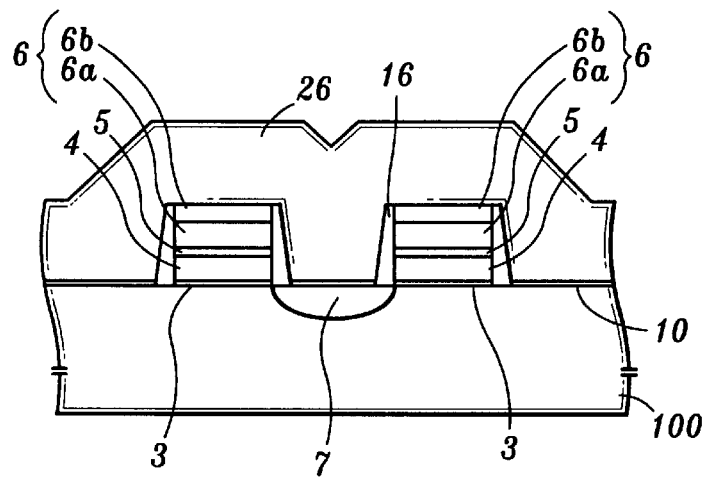
Figure 16B:
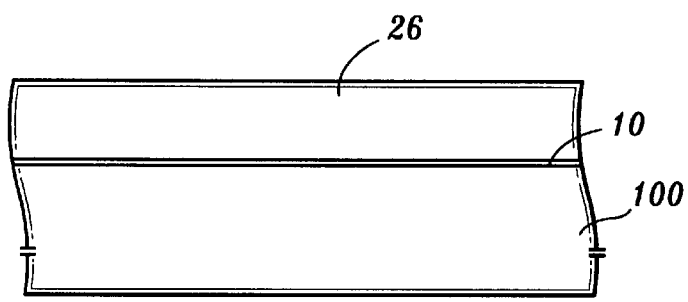
Figure 17A:
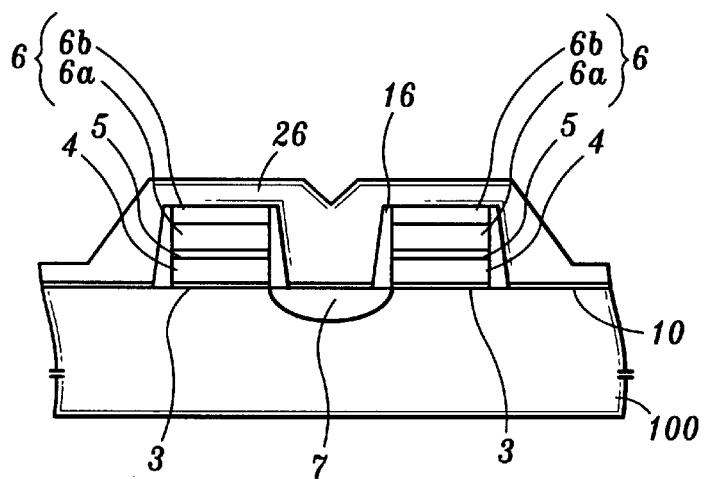
Figure 17B:
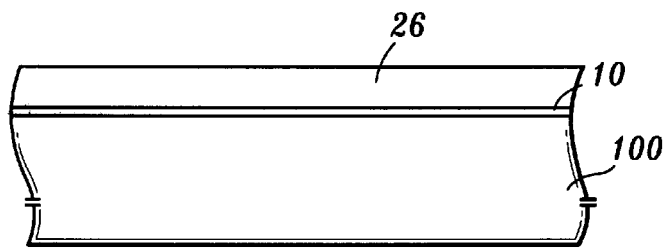
Figure 18A:
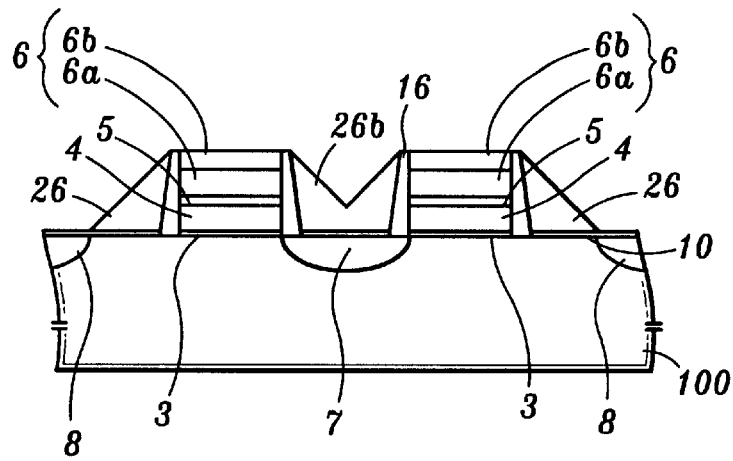
Figure 18B:
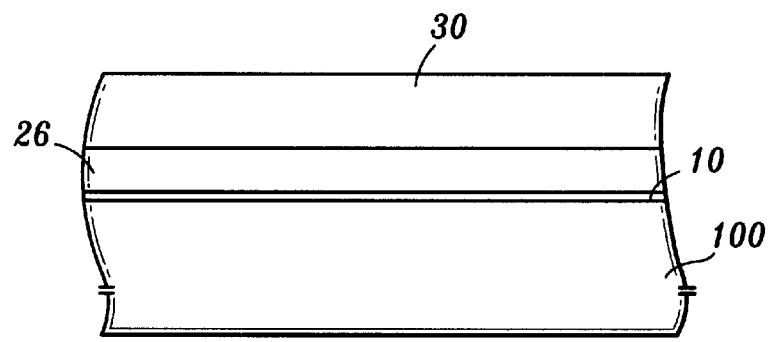

In the present application, when a polysilicon layer and/or a high melting point metal layer or a metal silicide layer are formed on the polysilicon side wall 26, as shown in FIGS. 16 to 18, the polysilicon side wall 26 is employed as a first layer forming the gate electrodes of peripheral circuits. The polysilicon side wall 26 has a large thickness. Preferably, the etching-back process for forming the side 26 wall is performed by two processing steps between which a photolithography process is performed. This reduces the slope and/or height of the geographical steps of the gate electrodes in the peripheral circuit.

In the first step shown in FIG. 17, the entire surface is isotopically etched-back. Then in the second step shown in FIG. 18, only the memory cell region is anisotropically etched-back. As a result of the isotropic etching-back in the first step, the geographical steps of the polysilicon film, the polysilicon side wall 26 can be thick enough in a lateral direction after the anisotropic etching in the second processing step.

With anisotropic etching, if a film has a large thickness, the resultant side wall generally has a large thickness (measured in a lateral direction in the structure). However, variations in the thickness of a deposited film increases as the thickness of the film increases. As a result, a longer over-etching time is needed to form thicker films. This makes it difficult to obtain a sufficiently large side wall thickness in the lateral direction in the structure. Thus, by employing the above two step etch-back process, a sufficiently large side wall thickness can be achieved due to the reduced number of processing steps.

Figure 19:
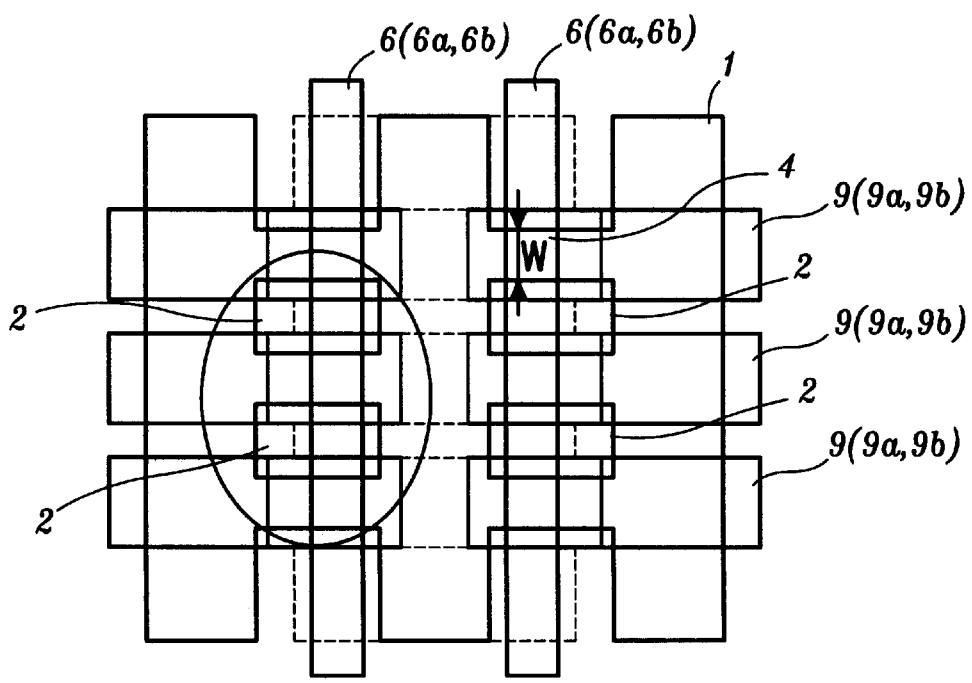
FIG. 19 is a plan view illustrating another embodiment of the memory device according to present application.
Figure 20:
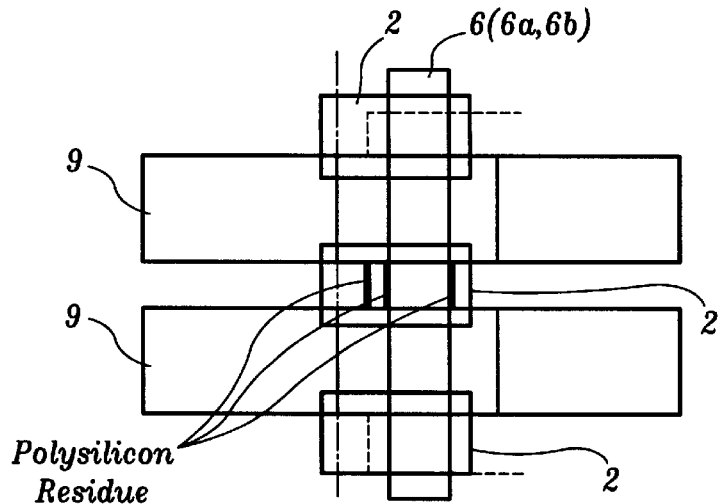
FIG. 20 is an enlarged plan view of the circular region shown in FIG. 19.
Figure 21:
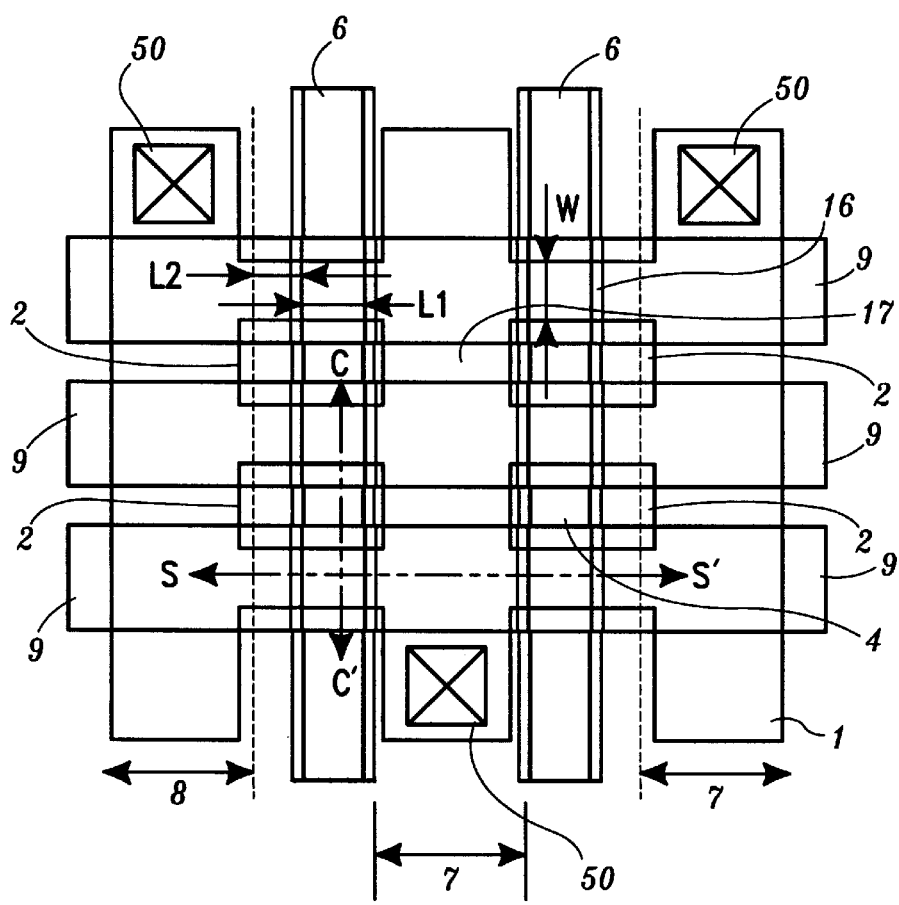
FIG. 21 is a plan view illustrating a conventional flash memory device.
Figure 22:
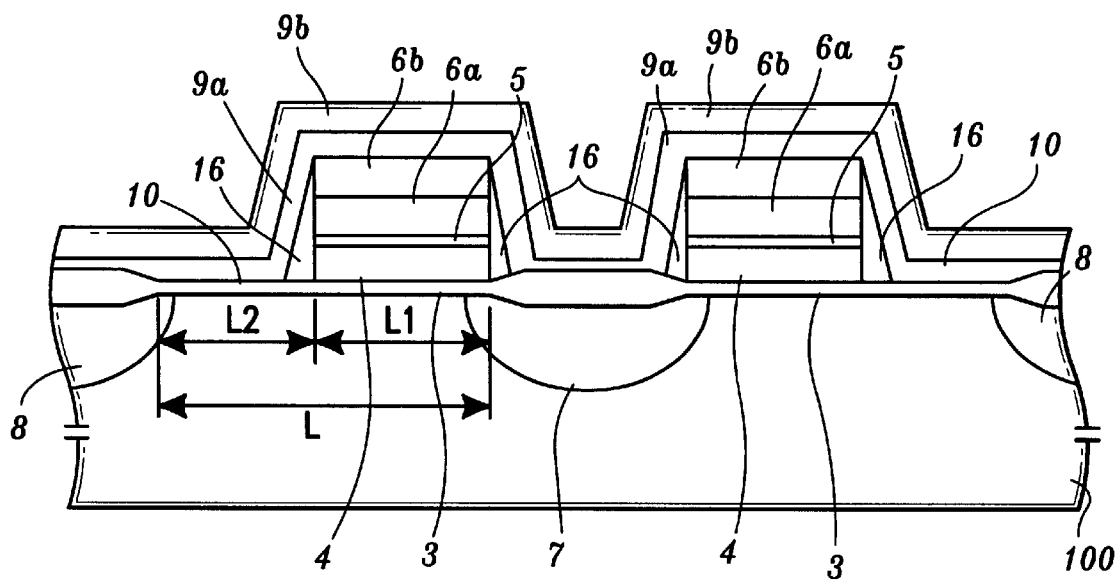
FIG. 22 is a cross-sectional view of the flash memory device of FIG. 21 taken along line S–S'.
Figure 23:
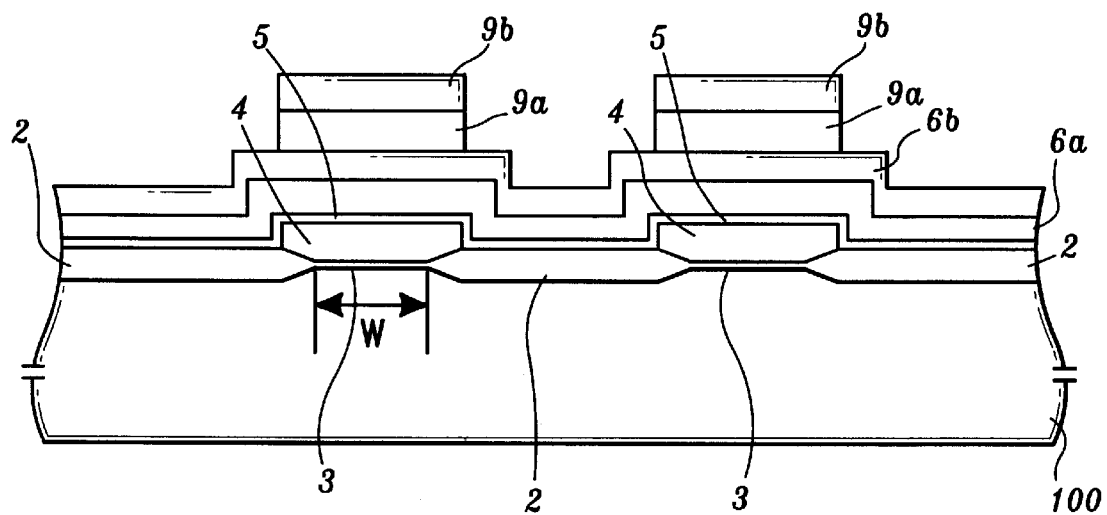
FIG. 23 is a cross-sectional view of the flash memory device of FIG. 21 taken along line C–C'.

In another embodiment described below, after forming the select gate line 9 and before forming the gate electrodes of the peripheral MOS circuit, slight oxidation is performed so as to prevent the formation of an electrical path between adjacent select gate lines 9 which may create an electrical short therebetween. FIGS. 19 and 20 illustrate those areas where a residual of polysilicon is easily produced which can lead to an electric short path. FIG. 20 is an enlarged plan view illustrating the details of the circular region of FIG. 19 which corresponds to the edges in the region 54 shown in FIGS. 1 and 2.

In the case of the method in which the polysilicon side wall 26 used in the self-alignment ion implantation process is removed, if it is tried to deal with the residual of polysilicon by means of oxidation, a gate "bird's beak" is produced which affects the tunnel erasing characteristics of the cell. In instances where the side wall film 26b is not removed, it is possible to perform oxidation after forming the select gate line 9. This oxidation step after forming the select gate line avoids the bird's beak effect. In the latter technique, however, it is required to form a protective insulating layer such as a CVD oxide film on the high melting point metal silicide layer of the select gate line 9 so as to protect the metal silicide layer from abnormal oxidation.

In the present invention, as described above, the steepness or the height of geometrical steps is reduced by intentionally keeping a part of the film forming the first side wall used in the self-alignment process remaining without being removed, or by using the first side wall used in the self-alignment process and also as a part of the select gate electrode. This allows an improvement in the resolution of the photolithography process and reduces the number of processing steps.

Compared with the technique in which the polysilicon side wall is removed after the self-alignment ion implantation, the technique according to the invention not only leads to the reduction in the number of processing steps but also makes it possible to avoid the formation of abrupt steps on the sides of the drain and source lines. That is, the geometric steps have a gradual slope with no overhang.

In the case where the polysilicon layer used as the first side wall is also used as the gate electrodes of the peripheral circuit, the etching-back process is divided into two steps between which a photolithography process is performed so as to reduce the steepness or the height of the geographic steps of the gate electrodes of the peripheral circuit.

In the present invention, slight oxidation is performed after forming the select gate line and before forming the gate electrodes of the peripheral circuit so as to prevent the formation of an electrical short path between select gates.

What is claimed is:

1. A method of producing a nonvolatile semiconductor memory, comprising:

forming stacked gate structures on a semiconductor substrate defining source and drain line regions relative to said stacked gate structures, wherein said source and drain line regions are parallel to said stacked gate structures, and wherein at least said source line region is spaced from said stacked gate structure by a sub-channel region and said drain line region is adjacent said stacked gate structure, a distance between said stacked gate structure and said source line region defined as a split gate length;

forming a side wall film on a side of each of said stacked gate structures;

filling regions adjacent said drain line regions with a material that is the same as a material used to form said side wall films;

implanting impurity ions in said source line regions in a self-alignment fashion using said side wall films and said filled regions as masks so as to form source lines the split gate length being defined by a width of said side wall films; and forming line shaped select gate electrodes on top and side surfaces of said stacked gate structures via insulating films and on said sub-channel regions of said substrate via gate oxide films, wherein said select gate electrodes are formed without removing said material in said filled regions.

2. The method according to claim 1, wherein said side wall films are formed on said sub-channel regions of said substrate.

3. The method according to claim 1, wherein said side wall films and said filled regions are formed of oxide and/or nitride.

4. The method according to claim 1, wherein said side wall films and said filled regions are formed of polysilicon.

5. The method according to claim 1, said side wall films and said filled regions are used as a portion of each of said select gate electrodes.

6. The method according to claim 1, wherein a polysilicon layer having a thickness of about 10 to 30 mm is formed on each of said side wall films and said filled regions, and a high melting point metal layer or a high melting point metal silicide layer is formed on said polysilicon layer.

7. The method according to claim 6, wherein said side wall films are formed of polysilicon, and wherein said side wall films or said polysilicon layers and/or high melting point metal layers or high melting point metal silicide layers are used to form a gate electrode of a peripheral circuit.

8. The method according to claim 7, wherein when the polysilicon layer of said side wall films are used to form the gate electrode of a peripheral circuit, an two step etching-back processing is performed in such a manner that a photolithography process is performed between each etching-back step so as to reduce a slope and/or height of geographical steps of the gate electrode of the peripheral circuit.

9. The method according to claim 1, wherein oxidation is performed after forming said select gate electrodes and before forming the gate electrode of a peripheral circuit.

* * * * *